(12) United States Patent
Kiyama et al.

(10) Patent No.: US 7,531,889 B2
(45) Date of Patent: May 12, 2009

(54) EPITAXIAL SUBSTRATE AND SEMICONDUCTOR ELEMENT

(75) Inventors: Makoto Kiyama, Itami (JP); Takuji Okahisa, Itami (JP); Takashi Sakurada, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 610 days.

(21) Appl. No.: 11/219,546

(22) Filed: Sep. 1, 2005

(65) Prior Publication Data

US 2006/0046331 A1    Mar. 2, 2006

(30) Foreign Application Priority Data

Sep. 1, 2004  (JP)  ............... 2004-254815

(51) Int. Cl.
*H01L 31/112* (2006.01)
*H01L 29/47* (2006.01)
*H01L 29/20* (2006.01)

(52) U.S. Cl. ............ 257/615; 257/289; 257/472; 257/E29.081

(58) Field of Classification Search ............... 257/253, 257/94, 615, 472, 289
See application file for complete search history.

(56) References Cited

U.S. PATENT DOCUMENTS 7,078,731 B2 *   7/2006   D'Evelyn et al. ............. 257/94

7,361,946 B2 *   4/2008   Johnson et al. ............. 257/253
2003/0045035 A1   3/2003   Shenai et al.
2004/0082116 A1   4/2004   Kub et al.

FOREIGN PATENT DOCUMENTS

EP        1 174 929 A2     1/2002

OTHER PUBLICATIONS

European Search Report for EP 05 01 8528 mailed Mar. 3, 2006.
P. Kozodoy, et al., Electrical characterization of GaN p-n junctions with and without threading dislocations, Applied Physics Letters, Aug. 17, 1998, pp. 975-977, vol. 73, No. 7, American Institute of Physics.
Y. Irokawa, et al., Current-voltage and reverse recovery characteristics of bulk GaN p-i-n rectifiers, Applied Physics Letters, Sep. 15, 2003, pp. 2271-2273, vol. 83, No. 11, American Institute of Physics.

* cited by examiner

*Primary Examiner*—Davienne Monbleau
*Assistant Examiner*—Monica D Harrison
(74) *Attorney, Agent, or Firm*—Darby & Darby PC

(57) ABSTRACT

In a Schottky diode 11, a gallium nitride support base 13 includes a first surface 13a and a second surface 13b opposite from the first surface and has a carrier concentration exceeding $1\times10^{18}$ cm$^{-3}$. A gallium nitride epitaxial layer 15 is disposed on the first surface 13a. An Ohmic electrode 17 is disposed on the second surface 13b. The Schottky electrode 19 is disposed on the gallium nitride epitaxial layer 15. A thickness D1 of the gallium nitride epitaxial layer 15 is at least 5 microns and no more than 1000 microns. Also, the carrier density of the gallium nitride epitaxial layer 15 is at least $1\times10^{14}$ cm$^{-3}$ and no more than $1\times10^{17}$ cm$^{-3}$.

28 Claims, 8 Drawing Sheets

EPITAXIAL SUBSTRATE AND SEMICONDUCTOR ELEMENT

INCORPORATION BY REFERENCE

The present application claims priority under 35 U.S.C. §119 to Japanese Patent Application No. 2004-254815 filed on Sep. 1, 2004 in the Japanese language, which is hereby incorporated by reference in its entirety.

BACKGROUND OF THE INVENTION

1. Field of the Invention

The present invention relates to an epitaxial substrate and a semiconductor element.

2. Description of the Background Art

Y. Irokawa, et. al., Appl. Phys. Lett., Vol. 83, No. 11, 15 Sep. 2003 describes a PIN diode. The PIN diode is equipped with an epitaxial layer grown on a GaN free-standing substrate. The thick film used as the GaN free standing substrate is grown using the hydride vapor phase epitaxy (HVPE) method on an $Al_2O_3$ substrate. A laser is applied to this thick film to separate it from the $Al_2O_3$ substrate to form the GaN free-standing substrate. On this GaN free-standing substrate, metal-organic vapor phase growth epitaxy is used to grow an undoped gallium nitride film with a thickness of 3 microns. Next, an Mg-doped gallium nitride film having a thickness of 0.3 microns is grown on this undoped gallium nitride film. The GaN free-standing substrate, the undoped gallium nitride film, and the Mg-doped gallium nitride film form a PIN structure.

In P. Kozodoy, et al., Appl. Phys. Lett., Vol. 73, No. 7, 17 Aug. 1998, characteristics of a gallium nitride pn junction are described. First, a GaN film having a thickness of 2 macrons is grown on a c-plane sapphire substrate using metal-organic vapor phase growth epitaxy with an $SiO_2$ mask for LEO recombination. The mask is formed as stripes with 5 micron openings and spaced at intervals of 45 microns. In LEO growth, gallium nitride grows perpendicular to the mask openings and overgrows horizontally on the mask. The height and the overgrowth length of the grown gallium nitride are both approximately 8 microns. A pn junction diode is formed on this LEO gallium nitride region. This pn junction diode includes an n-type GaN film having a thickness of 1 micron, a magnesium-doped p-type GaN film having a thickness of 0.5 microns grown on top of this. The size of this pn junction diode is 2 microns×20 microns.

In the gallium nitride pn junction diode described in the Kozodoy paper, reverse leakage current at low-dislocation areas (less than $10^6$ cm$^{-2}$) is reduced compared to high-dislocation areas (approximately $4 \times 10^8$ cm$^{-2}$), indicating that reverse breakdown is improved. However, the device structure in this paper is complex and production of the device on the low-dislocation area is not practical. In the Irokawa paper described above, the thickness of the GaN epitaxial layer is 3 microns and is not sufficient for a carrier concentration of $5 \times 10^{16}$ cm$^{-3}$. The reverse blocking voltage of the PIN diode in the Irokawa paper is also not high enough.

The breakdown mechanism of nitride semiconductors such as diodes is as follows. When the field intensity at the Schottky junction or the PN junction, which is the maximum field intensity in the reverse bias state, exceeds a critical value, impact ionization causes reverse leakage current to increase suddenly. This is the phenomenon known as breakdown. The ideal breakdown is when the epitaxial layer is thick enough where the depletion layer extends and the depletion layer is in the epitaxial layer even when the field intensity at the junction reaches the critical value. However, if the thickness of the epitaxial layer is not adequate for the carrier concentration, causing depletion of the entire thickness of the epitaxial layer before the field intensity at the junction reaches the critical value (punch-through), the field intensity at the junction will reach the critical value earlier so that breakdown takes place at a lower voltage compared to the ideal case described above. Also, since the depletion layer extends to the boundary surface between the epitaxial layer and the substrate, leaked current caused by imperfections in the boundary surface can reduce the reverse characteristics of the leakage current, possibly lowering the breakdown voltage. If punch-through takes place due to these factors, the breakdown voltage will be lower.

The object of the present invention is to overcome these problems and to provide a semiconductor element that contains a group III compound semiconductor layer that includes a structure for improving breakdown. Another object of the present invention is to provide an epitaxial substrate for this semiconductor element.

SUMMARY OF THE INVENTION

According to one aspect, the present invention provides a semiconductor element including a group III nitride semiconductor layer. The semiconductor element includes: (a) a gallium nitride free-standing substrate including a first surface and a second surface opposite from the first surface and having a carrier concentration exceeding $1 \times 10^{18}$ cm$^{-3}$; (b) a first gallium nitride epitaxial film disposed on the first surface; (c) an Ohmic electrode disposed on the second surface; and (d) a Schottky electrode disposed on the first gallium nitride epitaxial layer. The first gallium nitride epitaxial film has a thickness of at least 5 microns and no more than 1000 microns. The first gallium nitride epitaxial film has a carrier concentration of at least $1 \times 10^{14}$ cm$^{-3}$ and no more than $1 \times 10^{17}$ cm$^{-3}$. The semiconductor element is a Schottky diode.

In this Schottky diode, since the first gallium nitride epitaxial layer has a thickness of at least 5 microns and no more than 1000 microns and since the first epitaxial layer has a carrier concentration of at least $1 \times 10^{14}$ cm$^{-3}$ and no more than $1 \times 10^{17}$ cm$^{-3}$, the thickness and carrier concentration of the epitaxial layer can be designed to achieve an ideal breakdown with no punch-through.

According to another aspect, the present invention provides a semiconductor element containing a group III nitride semiconductor layer. The semiconductor element includes: (a) a gallium nitride support base including a first surface and a second surface opposite from the first surface and having a carrier concentration exceeding $1 \times 10^{18}$ cm$^{-3}$; (b) a first gallium nitride epitaxial layer disposed on the first surface; (c) an Ohmic electrode disposed on the second surface; (d) a second gallium nitride epitaxial layer disposed on the first gallium nitride epitaxial layer and containing a p-type dopant; and (e) an Ohmic electrode disposed on the second gallium nitride epitaxial layer. The gallium nitride support base has n-type conductivity. The first gallium nitride epitaxial layer has a thickness of at least 5 microns and no more than 1000 microns. The first gallium nitride epitaxial layer has a carrier concentration of at least $1 \times 10^{14}$ cm$^{-3}$ and no more than $1 \times 10^{17}$ cm$^{-3}$. The semiconductor element is a pn-junction diode.

In this pn-junction diode, since the first gallium nitride epitaxial layer has a thickness of at least 5 microns and no more than 1000 microns and since the first gallium nitride epitaxial layer has a carrier concentration of at least $1 \times 10^{14}$ cm$^{-3}$ and no more than $1 \times 10^{17}$ cm$^{-3}$, the thickness and carrier concentration of the epitaxial layer can be designed to achieve an ideal breakdown with no punch-through.

According to another aspect, the present invention provides a semiconductor element containing a group III nitride semiconductor layer. The semiconductor element includes: (a) a gallium nitride support base including a first surface and a second surface opposite from the first surface and having a carrier concentration exceeding $1\times10^{18}$ cm$^{-3}$; (b) a first gallium nitride epitaxial layer disposed on the first surface; (c) a p-type semiconductor region disposed in the first gallium nitride epitaxial layer; (d) an n-type semiconductor region disposed in the p-type semiconductor region; (e) a source electrode disposed on the n-type semiconductor region; (f) a drain electrode disposed on the second surface; (g) an insulation layer disposed on the first gallium nitride epitaxial film; and (f) a gate electrode disposed on the insulation layer. The first gallium nitride epitaxial layer has a thickness of at least 5 microns and no more than 1000 microns. The first gallium nitride epitaxial layer has a carrier concentration of at least $1\times10^{14}$ cm$^{-3}$ and no more than $1\times10^{17}$ cm$^{-3}$. The semiconductor element is an MIS transistor.

This MIS transistor has a structure that includes a source electrode disposed on the n-type semiconductor region and a drain electrode disposed on the second surface of the substrate wherein current flows vertically from one to the other. Since the first gallium nitride epitaxial layer has a thickness of at least 5 microns and no more than 1000 microns and since the first epitaxial layer has a carrier concentration of at least $1\times10^{14}$ cm$^{-3}$ and no more than $1\times10^{17}$ cm$^{-3}$, the thickness and carrier concentration of the epitaxial layer can be designed to achieve an ideal breakdown with no punch-through.

In the semiconductor element according to the present invention, it would be preferable for the p-type dopant of the p-type semiconductor region to be introduced through ion implantation. Also, in the semiconductor element according to the present invention, it would be preferable for the n-type dopant of the n-type semiconductor region to be introduced through ion implantation.

In the semiconductor element of the present invention, it would be preferable for the surface orientation of the first surface of the gallium nitride support base to have a surface orientation that is within a range of no more than +5 deg and at least −5 deg of (0001). This provides a low-dislocation GaN substrate.

In the semiconductor element of the present invention, it would be preferable for the first surface of the gallium nitride free-standing substrate to have a surface orientation that is within a range of no more than +5 deg and at least −5 deg of either (1-100) or (11-20).

With this semiconductor element, the dislocation in the epitaxial layer is reduced, the reverse leakage current is reduced, and the reverse breakdown improves.

In the semiconductor element of the present invention, it would be preferable for the first surface of the gallium nitride support base to have a dislocation density of no more than $1\times10^{8}$ cm$^{-2}$.

With this semiconductor element, the dislocation density is low so that the dislocation in the epitaxial layer is reduced. As a result, the reverse leakage current is reduced and the reverse breakdown improves.

In the semiconductor element of the present invention, it would be preferable for the first surface of the gallium nitride support base to include a first area with a dislocation density of no more than $1\times10^{8}$ cm$^{-2}$ and a second area with a dislocation density greater than the dislocation density of the first area.

With this semiconductor element, the dislocation in the epitaxial layer formed on the area with the lower dislocation density is lower. As a result, the reverse leakage current of the semiconductor element is further reduced and the reverse breakdown improves.

According to another aspect, the present invention provides an epitaxial substrate including: (a) a gallium nitride free-standing substrate including a first surface and a second surface opposite from the first surface and having a carrier concentration exceeding $1\times10^{18}$ cm$^{-3}$; and (b) a first gallium nitride epitaxial film disposed on the first surface. The first gallium nitride epitaxial film has a thickness of at least 5 microns and no more than 1000 microns. The first gallium nitride epitaxial film has a carrier concentration of at least $1\times10^{14}$ cm$^{-3}$ and no more than $1\times10^{17}$ cm$^{-3}$.

With this epitaxial substrate, since the thickness of the first gallium nitride epitaxial film is at least 5 microns and no more than 1000 microns and since the first gallium nitride epitaxial film has a carrier concentration of at least $1\times10^{14}$ cm$^{-3}$ and no more than $1\times10^{17}$ cm$^{-3}$, the thickness and the carrier concentration of the epitaxial layer can be designed to achieve an ideal breakdown with no punch-through. As a result, an epitaxial substrate is provided for a semiconductor element with improved reverse breakdown.

An epitaxial substrate of the present invention can also include a second gallium nitride epitaxial film disposed on the first gallium nitride epitaxial film and including a p-type dopant. With this epitaxial substrate, an epitaxial substrate is provided for pn-junction diodes with improved reverse breakdown. Also, in the epitaxial substrate of the present invention, it would be preferable for the p-type dopant to be introduced through ion implantation or for the p-type epitaxial layer to be formed through metal-organic vapor phase growth epitaxy.

An epitaxial substrate of the present invention can include: (c) a p-type semiconductor region disposed in the first gallium nitride epitaxial layer; and an n-type semiconductor region disposed in the p-type semiconductor region. It would be preferable for the first gallium nitride epitaxial film and the gallium nitride free-standing substrate to have n-type conductivity.

With this epitaxial substrate, an epitaxial substrate for transistors with improved reverse breakdown is provided.

In the epitaxial substrate of the present invention, it would be preferable for the first gallium nitride epitaxial film to be grown using HVPE. Since the growth speed is fast, a thick epitaxial film can be provided within a practical amount of time. In the epitaxial substrate of the present invention, it would be preferable for the second gallium nitride epitaxial film to be formed using metal-organic vapor phase growth epitaxy. With this epitaxial substrate, a high-quality epitaxial film can be provided.

In the epitaxial substrate of the present invention, it would be preferable for the surface orientation of the first surface of the gallium nitride free-standing substrate to have a surface orientation that is within a range of no more than +5 deg and at least −5 deg of (0001).

With this epitaxial substrate, a low-dislocation GaN substrate is provided.

In the epitaxial substrate of the present invention, it would be preferable for the first surface of the gallium nitride free-standing substrate to have a surface orientation that is within a range of no more than +5 deg and at least −5 deg of either (1-100) or (11-20).

With this epitaxial substrate, an epitaxial substrate for semiconductor elements is provided in which the dislocation in the epitaxial layer is reduced, the reverse leakage current is reduced, and reverse breakdown is improved.

In the epitaxial substrate of the present invention, it would be preferable for the dislocation density in the epitaxial layer to be no more than $1 \times 10^8$ cm$^{-2}$.

With this epitaxial substrate, the dislocation density is low so that the dislocation in the epitaxial layer is reduced. As a result, an epitaxial substrate for semiconductor elements is provided in which reverse leakage current is reduced and reverse breakdown is improved.

In the epitaxial substrate of the present invention, it would be preferable for the first surface of the gallium nitride support base to include a first area with a dislocation density of no more than $1 \times 10^8$ cm$^{-2}$ and a second area with a dislocation density greater than the dislocation density of the first area.

With this epitaxial substrate, the semiconductor element can be formed on the area with the lower dislocation density so that the dislocation in the epitaxial layer is further reduced. As a result, an epitaxial substrate for semiconductor elements is provided with reduced reverse leakage current and improved reverse breakdown.

The above, and other objects, features and advantages of the present invention will become apparent from the following description read in conjunction with the accompanying drawings, in which like reference numerals designate the same elements.

As described above, with the present invention, a group III nitride element with a structure that can improve reverse breakdown is provided. Also, an epitaxial substrate for this semiconductor element is provided.

DETAILED DESCRIPTION OF THE INVENTION

The perspectives of the present invention can be easily understood based on the descriptions below and the attached figures. Next, semiconductor elements and epitaxial substrates according to embodiments of the present invention will be described. When possible, identical elements will be assigned like numerals.

FIRST EMBODIMENT

Figure 1:
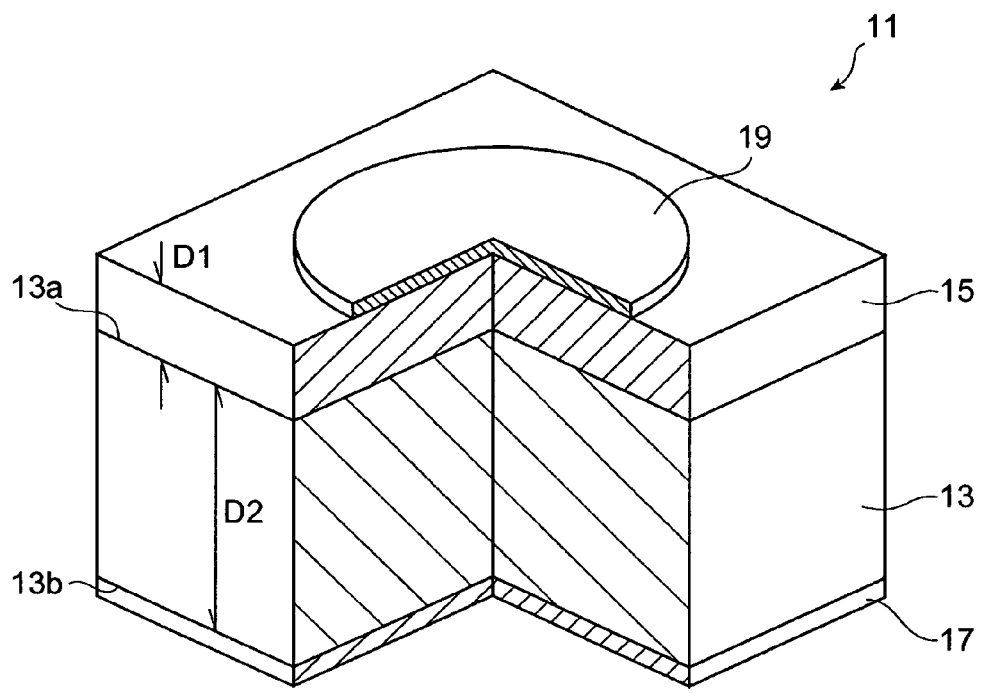
FIG. 1 is a drawing showing a semiconductor element containing a group-III nitride semiconductor layer according to a first embodiment.

FIG. 1 shows a group III nitride semiconductor element according to a first embodiment of the present invention. This semiconductor element is a Schottky diode 11. The Schottky diode 11 is equipped with a gallium nitride support base 13, a gallium nitride epitaxial layer 15, an Ohmic electrode 17, and a Schottky electrode 19. The gallium nitride support base 13, which includes a first surface 13a and a second surface 13b opposite from the first surface, has a carrier concentration of over $1 \times 10^{18}$ cm$^{-3}$. The gallium nitride epitaxial layer 15 is disposed on the first surface 13a. The Ohmic electrode 17 is disposed on the second surface 13b. The Schottky electrode 19 is disposed on the gallium nitride epitaxial layer 15. The thickness D1 of the gallium nitride epitaxial layer 15 is 5 microns or more and 1000 microns or less. Also, the carrier concentration of the gallium nitride epitaxial layer 15 is $1 \times 10^{14}$ cm$^{-3}$ or more and $1 \times 10^{17}$ cm$^{-3}$ or less. With the carrier concentration being $1 \times 10^{14}$ cm$^{-3}$ or more, the "on" resistance can be kept low. With the carrier concentration being $1 \times 10^{17}$ cm$^{-3}$ or less, the breakdown voltage can be increased.

In this Schottky diode 11, since the thickness of the gallium nitride epitaxial layer 15 is 5 microns or more and 1000 microns or less, and the carrier concentration is $1 \times 10^{14}$ cm$^{-3}$ or higher and $1 \times 10^{17}$ cm$^{-3}$ or lower, it is possible to design the thickness of the epitaxial layer and the carrier concentration in a suitable manner so that an ideal breakdown that does not lead to punch-throughs can be provided. Thus, the breakdown voltage of the Schottky diode 11 can be increased.

The carrier concentration of the GaN substrate is higher than the carrier concentration of the epitaxial layer. As shown in FIG. 1, in the Schottky diode 11, the Ohmic electrode 17 is disposed over the entirety of the second surface 13b. The Schottky electrode 19 is formed on a section of the surface of the epitaxial layer, e.g., as a circle at roughly the center of the element. For the Schottky electrode 19, it would be possible to use a material such as nickel gold (Ni/Au), but it would also be possible to use Pt/Au or Au. The gallium nitride support base 13 and the gallium nitride epitaxial layer 15 act as n-type conductors. The gallium nitride epitaxial layer 15 is grown homoepitaxially directly on the gallium nitride support base 13. It would be preferable for a thickness D2 of the gallium nitride support base 13 to be, for example, at least 100 microns and no more than 700 microns.

FIRST WORKING EXAMPLE

An HPVE-produced (0001) face GaN free-standing substrate is prepared. A Schottky diode is produced using the procedure described below. The carrier concentration of an n-type conductor GaN free-standing substrate is $3 \times 10^{18}$ cm$^{-3}$, and the thickness is 400 microns. The average dislocation density in this substrate is $5 \times 10^6$ cm$^{-2}$. An n-type conductor epitaxial film having a carrier concentration of $5 \times 10^{15}$ cm$^{-3}$ and a thickness of 20 microns is grown using HVPE on the GaN free-standing substrate, thus forming an epitaxial substrate (hereinafter referred to as sample A). An Ohmic electrode is formed on the back side of the substrate, and a Schottky electrode is formed on the epitaxial film. The Ohmic electrode is formed on the entire back surface of the substrate after organic cleaning is performed. To form the Ohmic electrode, Ti/Al/Ti/Au (20 nm/100 nm/20 nm/300 nm) are formed using EB vapor deposition. After the Ohmic electrode film is formed, it is alloyed for approximately 1 minute at 600 deg C. The Schottky electrode is formed as a 500 nm gold film using resistance heating deposition. The Schottky electrode is shaped as a circle with a 200 micron diameter. Before the Ohmic electrode and the Schottky electrodes are formed, and before the deposition, the epitaxial film surface is treated with an HCl solution (hydrochloric acid 1: purified water 1) at room temperature for 1 minute.

On a separate GaN free-standing substrate, an epitaxial film with a carrier concentration of $5 \times 10^{15}$ cm$^{-3}$ and a thickness of 3 microns is grown using HVPE to form an epitaxial substrate (hereinafter referred to as sample B). An Ohmic electrode and a Schottky electrode are formed in the same manner as described above.

Figure 2:
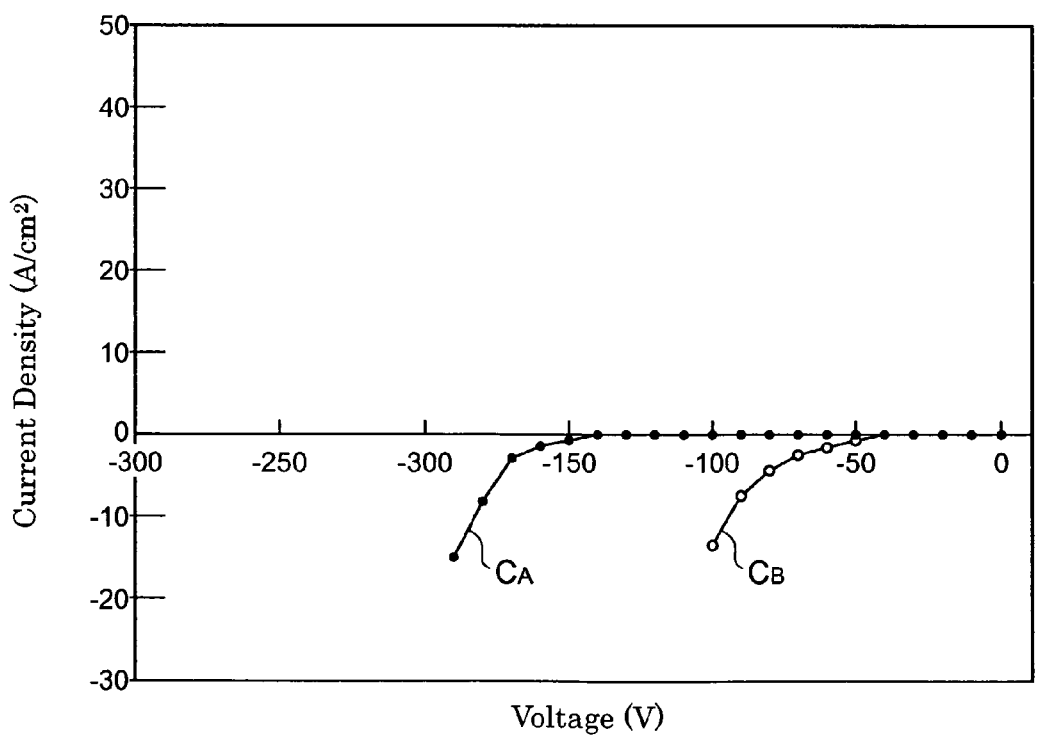
FIG. 2 is a drawing illustrating I-V characteristics of a sample A and a sample B.
Figure 3A:
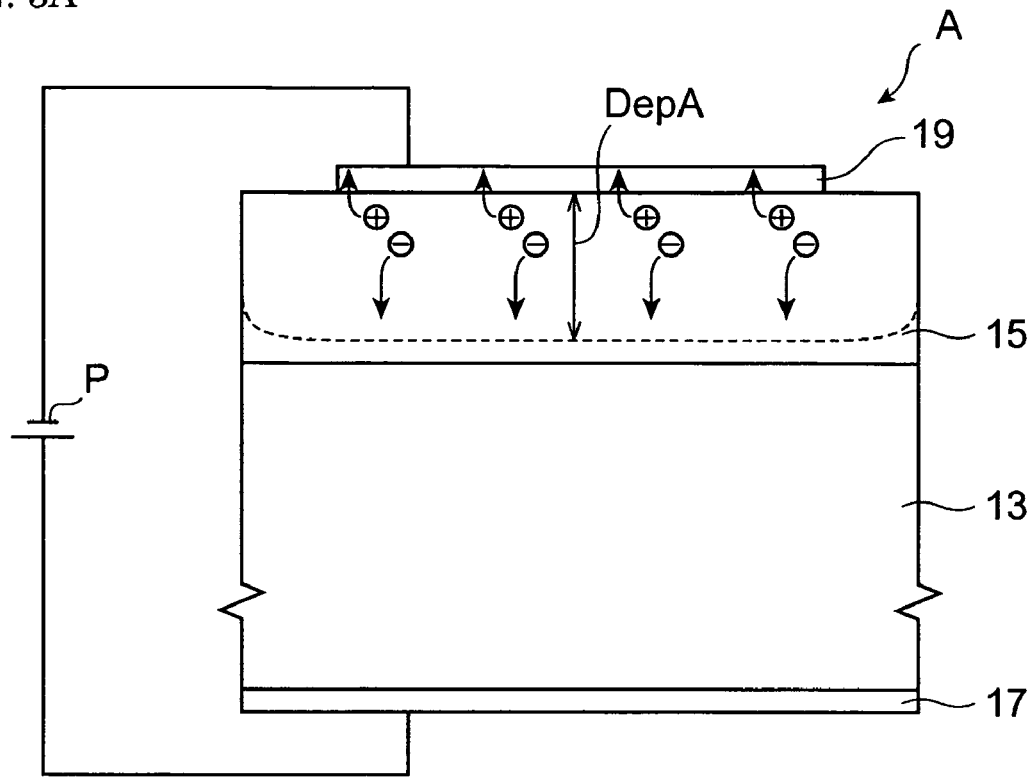
FIG. 3A is a drawing for the purpose of describing breakdown in a Schottky diode having a thick epitaxial film.
Figure 3B:
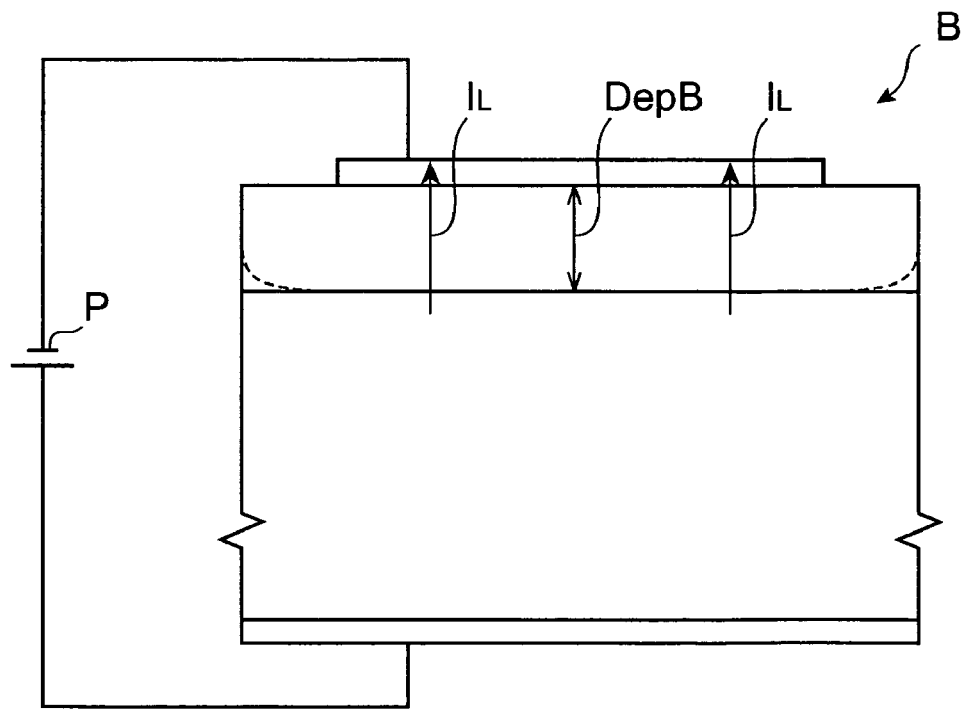
FIG. 3B is a drawing for the purpose of describing breakdown in a Schottky diode having a thin epitaxial film.

FIG. 2 is a drawing illustrating the I-V characteristics of sample A and sample B. In FIG. 2, a characteristic curve $C_A$ indicates the characteristics of sample A and a characteristic curve $C_B$ indicates the characteristics of sample B. FIG. 3A is a drawing for the purpose of describing the breakdown of a Schottky diode having a thick epitaxial film. FIG. 3B is a drawing for the purpose of describing the breakdown of a Schottky diode having a thin epitaxial film. The reverse breakdown of sample B is less than the reverse breakdown of sample A. The reason for this is as follows. In the sample A, the epitaxial layer is thick enough that, as shown in FIG. 3A, when the applied voltage is increased, impact ionization takes place around the boundary surface between the Schottky electrode and the epitaxial film before a depletion layer DepA reaches the boundary surface between the substrate and the epitaxial film, thus resulting in a flow of reverse leakage current. This impact ionization determines the reverse breakdown. In sample B, the epitaxial film does not have adequate thickness so that, as shown in FIG. 3B, when the applied voltage is increased, punch-through takes place, in which a depletion layer DepB reaches the boundary surface between the substrate and the epitaxial film before there is impact ionization at the epitaxial surface below the Schottky electrode. This reduces the reverse breakdown.

SECOND WORKING EXAMPLE

An HPVE-produced (0001) face GaN free-standing substrate is prepared. The carrier concentration of the n-type conductor GaN free-standing substrate is $3 \times 10^{18}$ cm$^{-3}$, and the thickness is 400 microns. The average dislocation density in this substrate is $5 \times 10^{5}$ cm$^{-2}$. An n-type conductor epitaxial film having a carrier concentration of $5 \times 10^{15}$ cm$^{-3}$ and a thickness of 20 microns is grown using HVPE on the GaN free-standing substrate, thus forming an epitaxial substrate (sample C). The process used in the first working example is used on this epitaxial substrate to produce a Schottky diode.

Figure 4:
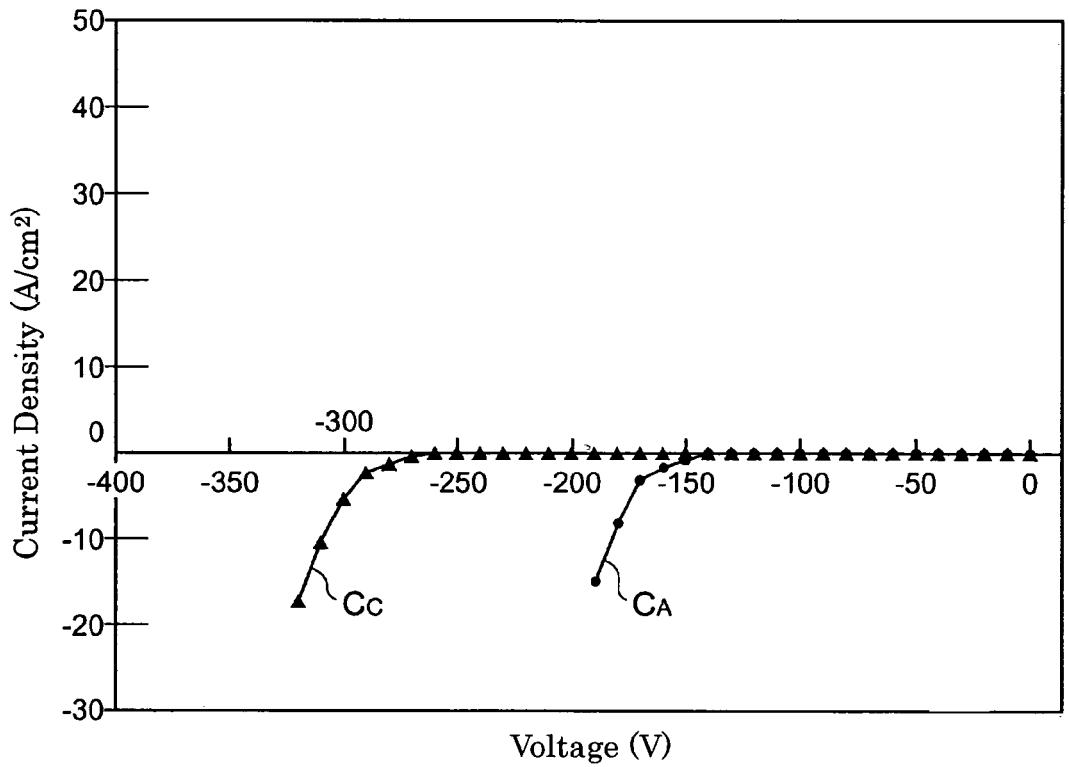
FIG. 4 is a drawing illustrating I-V characteristics of a sample A and a sample C.

FIG. 4 is a drawing showing the I-V characteristics of sample A and sample C. In FIG. 4, the characteristic curve $C_A$ indicates the characteristics of sample A, and a characteristic curve $C_C$ indicates the characteristics of sample C. The average dislocation density in the GaN free-standing substrate of sample A is $5 \times 10^{6}$ cm$^{-2}$, while the average dislocation density in the GaN free-standing substrate of sample C is $5 \times 10^{5}$ cm$^{-2}$. The reverse breakdown of sample C is high compared to the reverse breakdown of sample A. In other words, it is believed that dislocation in the support base increases the reverse leakage current.

THIRD WORKING EXAMPLE

An HPVE-produced (1-100) face GaN free-standing substrate is prepared. The carrier concentration of the n-type conductor GaN free-standing substrate is $3 \times 10^{18}$ cm$^{-3}$, and the thickness is 400 microns. The average dislocation density in this substrate is $5 \times 10^{5}$ cm$^{-2}$. An n-type conductor epitaxial film having a carrier concentration of $5 \times 10^{15}$ cm$^{-3}$ and a thickness of 20 microns is grown using HVPE on the GaN free-standing substrate, resulting in an epitaxial substrate (sample D). The process used in the first working example is used on this epitaxial substrate to produce a Schottky diode.

Figure 5:
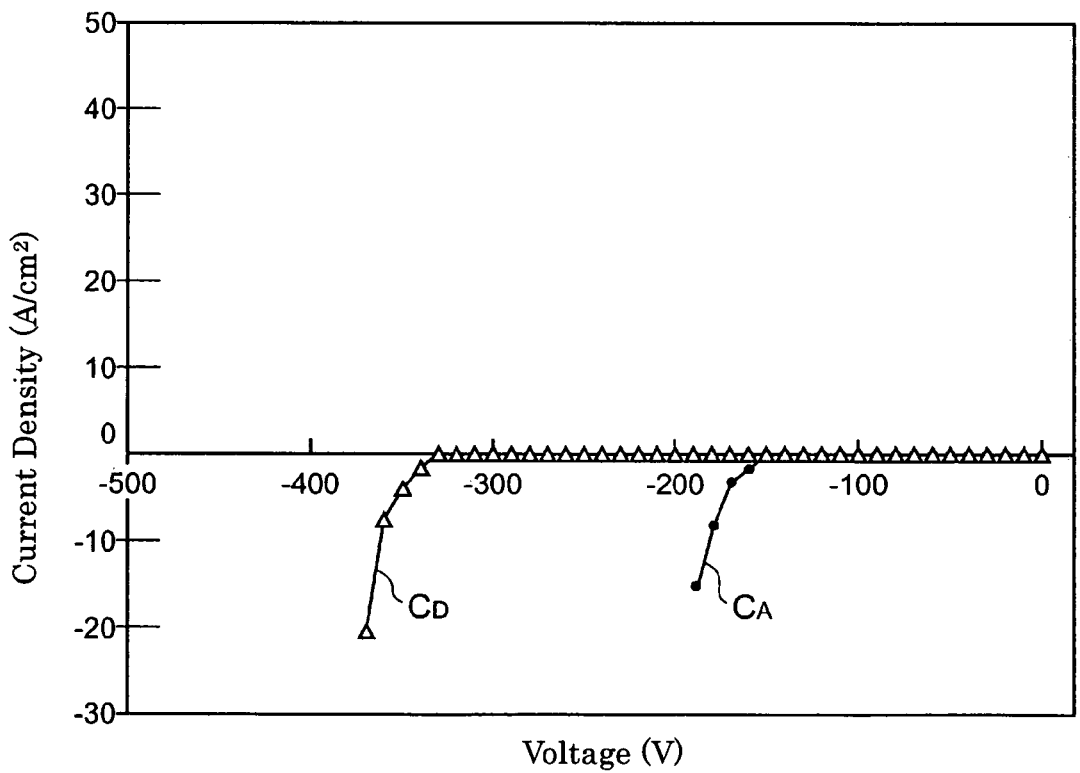
FIG. 5 is a drawing illustrating I-V characteristics of a sample A and a sample D.

FIG. 5 is a drawing illustrating the I-V characteristics of sample A and sample D. In FIG. 5, the characteristics curve $C_A$ indicates the characteristics of sample A, and the characteristics curve $C_D$ indicates the characteristics of sample D. Since the GaN free-standing substrate in sample A has a (0001) face while the GaN free-standing substrate in sample D has a (1-100) face, the reverse breakdown of sample C is improved compared to the reverse breakdown of sample A. More specifically, when a gallium nitride film is epitaxially grown on a (1-100) face, threading dislocation in the [0001] direction does not take place. As a result, there is very little leakage in this Schottky diode.

FOURTH WORKING EXAMPLE

An HPVE-produced (0001) face GaN free-standing substrate is prepared. The carrier concentration of the n-type conductor GaN free-standing substrate is $3 \times 10^{18}$ cm$^{-3}$, and the thickness is 400 microns. N-type conductor epitaxial films having a carrier concentration of $1 \times 10^{17}$ cm$^{-3}$ and thicknesses of 10, 5, and 3 microns are grown using HVPE on the GaN free-standing substrate, resulting in epitaxial substrates (referred to as samples E, F, G). The process used in the first working example is used on these epitaxial substrates to produce Schottky diodes.

Figure 6:
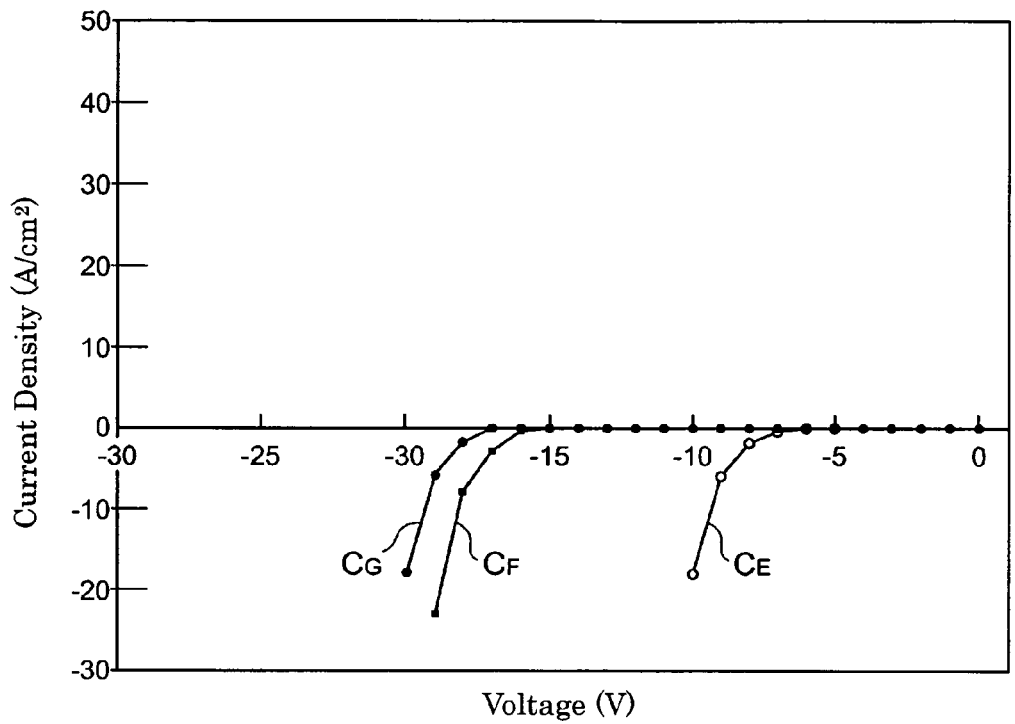
FIG. 6 is a drawing illustrating I-V characteristics of a sample E, a sample F, and a sample G.

FIG. 6 shows the I-V characteristics of samples E, F, G described above. In FIG. 6, the characteristics curves $C_E$, $C_F$, $C_G$ indicate the characteristics of samples E, F, G respectively. Sample E and sample F show roughly identical reverse breakdowns, but the reverse breakdown of sample G is smaller than the reverse breakdown of sample E and sample F. In sample G, it is believed that when the applied voltage is increased, a punch-through takes place where the depletion layer in the epitaxial film reaches the boundary surface between the substrate and the epitaxial film, thus lowering the reverse breakdown voltage. As a result, a thickness of at least 5 microns is needed for the epitaxial film.

In the drift layer (n-layer) of power conversion devices such as Schottky diodes, it would be preferable for the carrier concentration to be at least $1 \times 10^{17}$ cm$^{-3}$ in order to improve breakdown. To prevent punch-throughs, it is important to have an epitaxial thickness that is suitable for the carrier concentration. At a carrier concentration of $1 \times 10^{17}$ cm$^{-3}$, an epitaxial film thickness of 5 microns or more will provide adequate epitaxial film thickness for high breakdown.

SECOND EMBODIMENT

Figure 7:
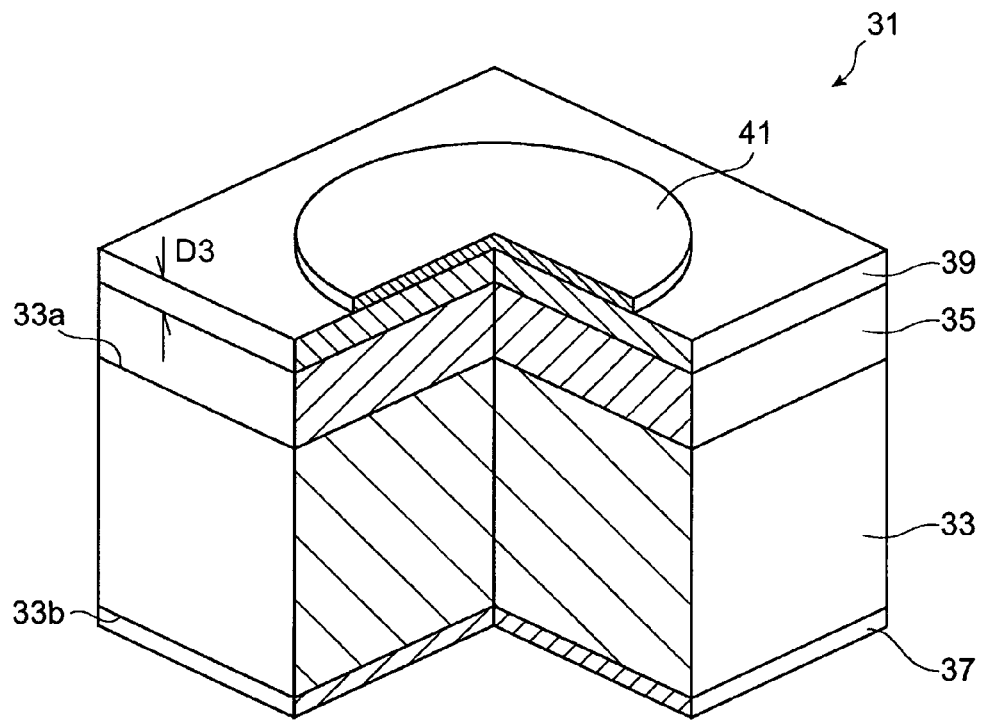
FIG. 7 is a drawing showing a semiconductor element containing a group-III nitride semiconductor layer according to a second embodiment.

FIG. 7 shows a semiconductor element containing a group-III semiconductor layer according to a second embodiment. The semiconductor element is a pn junction diode 31. The pn junction diode 31 includes: a gallium nitride support base 33; a first gallium nitride epitaxial layer 35; a first Ohmic electrode 37; a second gallium nitride epitaxial film 39; and a second Ohmic electrode 41. The gallium nitride support base 33 includes a first surface 33a and a second surface 33b opposite from the first surface 33a. The carrier concentration exceeds $1 \times 10^{18}$ cm$^{-3}$. The gallium nitride support base 33 has n-type conductivity. The thickness of the first gallium nitride epitaxial layer 35 is at least 5 microns and no more than 1000 microns. The carrier concentration of the first gallium nitride epitaxial layer 35 is at least $1\times10^{14}$ cm$^{-3}$ and no more than $1\times10^{17}$ cm$^{-3}$. The first gallium nitride epitaxial layer 35 is disposed on the first surface 33a. The first Ohmic electrode (e.g., cathode electrode) 37 is disposed on the second surface 33b. The second gallium nitride epitaxial film 39 is disposed on the first gallium nitride epitaxial layer 35 and includes a p-type dopant. The second Ohmic electrode (e.g., anode electrode) 41 is disposed on the second gallium nitride epitaxial film 39.

With this pre junction diode 31, since the thickness of the first gallium nitride epitaxial layer 35 is at least 5 microns and no more than 1000 microns, and since the carrier concentration of the first gallium nitride epitaxial layer 35 is at lease $1\times10^{14}$ cm$^{-3}$ and no more than $1\times10^{17}$ cm$^{-3}$, an ideal breakdown that does not generate punch-through can be achieved by designing the epitaxial layer thickness and the carrier concentration appropriately.

The gallium nitride support base 33 and the first gallium nitride epitaxial layer 35 have n-type conductivity and the second gallium nitride epitaxial layer 39 has p-type conductivity. The carrier concentration of the GaN free-standing substrate 33 is greater than the carrier concentration of the epitaxial layer 35. The carrier concentration of the first gallium nitride epitaxial layer 35 is less than the carrier concentration of the second gallium nitride epitaxial film 39. As a result, the depletion layer extends mainly to the first gallium nitride epitaxial layer 35. The thickness of the epitaxial layer 35 and the carrier concentration can be designed using the thickness and the carrier concentration of the Schottky diode 11 from the first embodiment. It would be preferable for the carrier concentration of the gallium nitride epitaxial layer 39 to be at least $1\times10^{17}$ cm$^{-3}$.

In the pn junction diode 31, the Ohmic (cathode) electrode 37 is disposed over the entirety of the second surface 33b of the substrate 33. The material for the cathode electrode can be, for example, Ti/Al/Ti/Au (20 nm/100 nm/20 nm/300 nm). The material for the anode electrode can be, for example Ni/Au (50 nm/100 nm). The first gallium nitride epitaxial layer 35 is grown homoepitaxially directly on the gallium nitride support base 33, and the second gallium nitride epitaxial layer 39 is grown homoepitaxially directly on the first gallium nitride epitaxial layer 35. It would be preferable for the thickness of the first gallium nitride epitaxial layer 35 to be greater than the thickness of the second gallium nitride epitaxial layer 39. It would be preferable for a thickness D3 of a second gallium nitride epitaxial layer to be, for example, at least 0.1 microns and no more than 10 microns.

FIFTH WORKING EXAMPLE

Figure 8:
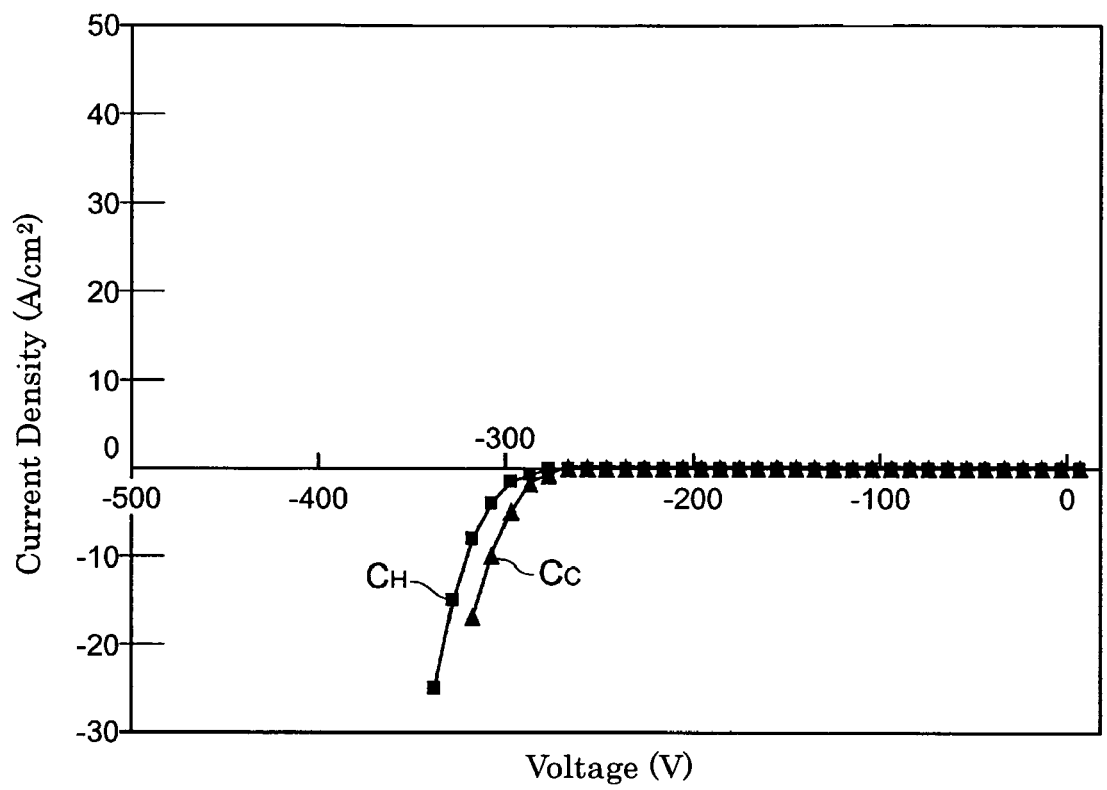
FIG. 8 is a drawing illustrating I-V characteristics of a sample H.

An HPVE-produced (0001) face GaN free-standing substrate is prepared. The carrier concentration of the n-type conductor GaN free-standing substrate is $3\times10^{18}$ cm$^{-3}$, and the thickness is 400 microns. The dislocation density of this substrate is $5\times10^5$ cm$^{-3}$. An n-type conductor epitaxial film having a carrier concentration of $5\times10^{15}$ cm$^{-3}$ and a thickness of 20 microns are grown using HVPE on the GaN free-standing substrate, resulting in an epitaxial substrate. Following this, a p-type conductor GaN layer is formed using the metal-organic vapor phase growth epitaxy, resulting in an epitaxial substrate containing a PN junction. Doping is performed using $5\times10^{19}$ cm$^{-3}$ of Mg as the dopant, and the thickness is 1 micron. The carrier concentration is $1\times10^{18}$ cm$^{-3}$. A p-type Ohmic electrode is formed by, first, using Cl$_2$-based RIE to dry etch the surface p-type layer to a mesa-shape with a depth of approximately 2 microns. Ni/Au resistance heating vacuum vapor deposition is performed on the mesa, followed by heat treatment at 700 deg C in nitrogen. The p-type electrode can be shaped, for example, as a circle with a diameter of 200 microns. An n-type Ohmic electrode is formed by performing EB vacuum vapor deposition of Ai/Al/Ti/Au (20 nm/100 nm/20 nm/300 um) on the entire rear surface of the substrate, followed by heat treatment in nitrogen for 1 minute at 600 deg C. (sample H). FIG. 8 shows the I-V characteristics of sample H. A reverse breakdown voltage is shown similar to that of sample C, which is a Schottky diode having the same structure.

THIRD EMBODIMENT

Figure 9A:
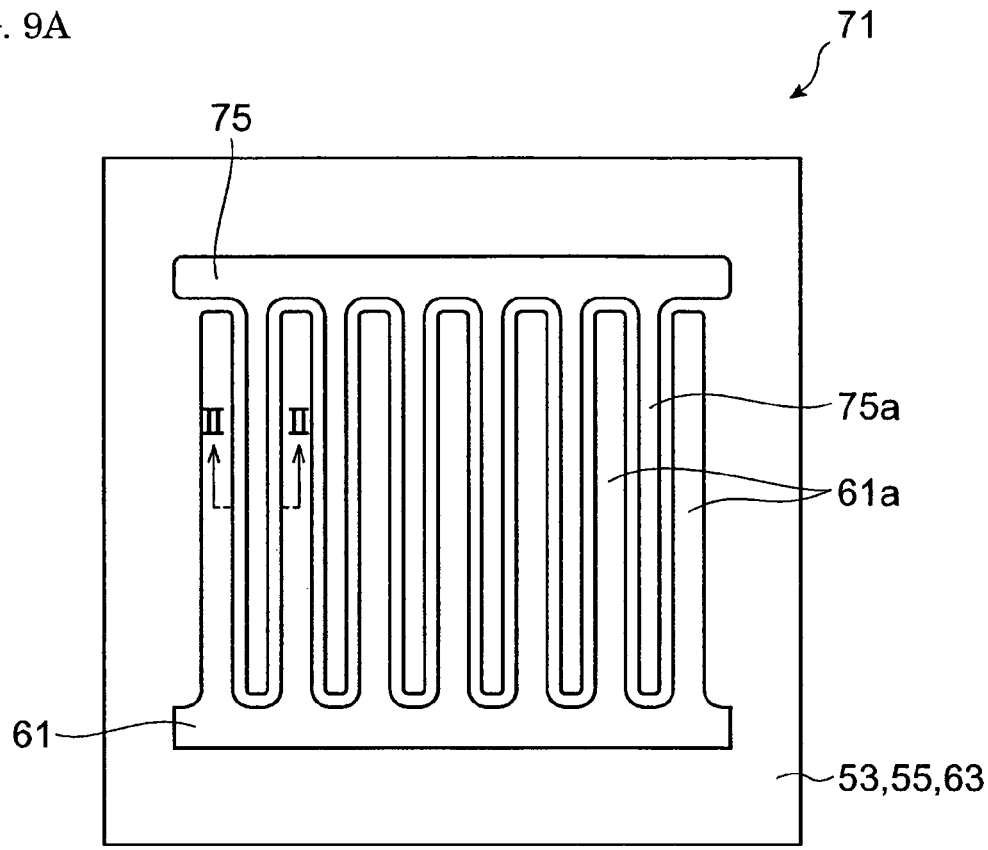
FIG. 9A is a drawing showing a transistor according to a fourth embodiment.
Figure 9B:
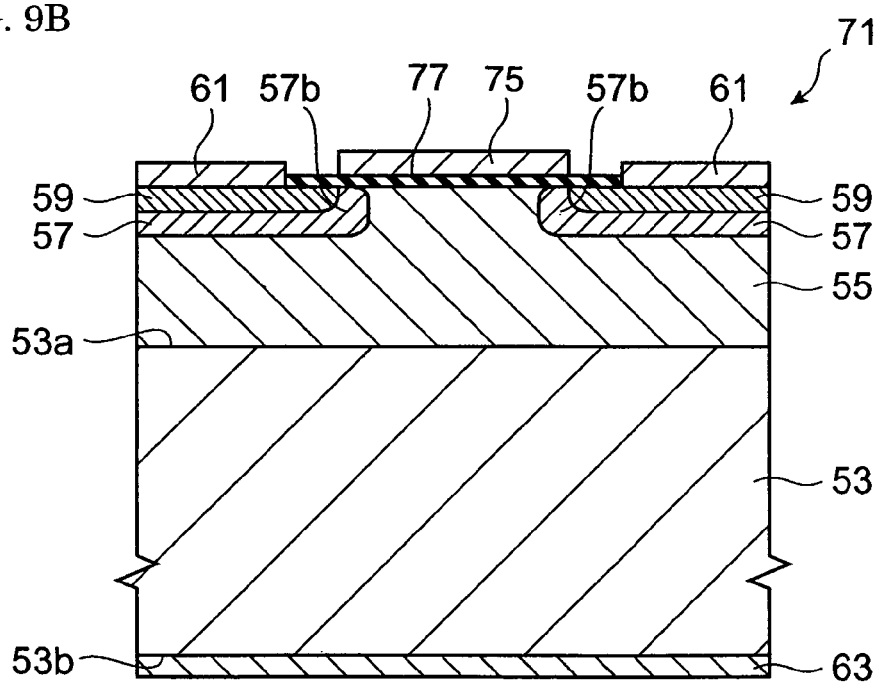
FIG. 9B is a drawing showing a cross-section along the II-II line in FIG. 9A.

FIG. 9A shows a transistor according to a third embodiment. FIG. 9B is a cross-section drawing along the II-II line in FIG. 9A. A group III nitride semiconductor MIS field effect transistor 71 includes: a gallium nitride support base 53; a gallium nitride epitaxial layer 55; a p-type semiconductor region 57; an n-type semiconductor region 59; a source electrode 61; a drain electrode 63; and a gate electrode 75. A gallium nitride support base 53 includes: a first surface 53a and a second surface 53b opposite from the first surface 53a. The carrier concentration exceeds $1\times10^{18}$ cm$^{-3}$. The gallium nitride epitaxial layer 55 is disposed on the first surface 53a. The p-type semiconductor region 57 is disposed on the gallium nitride epitaxial layer 55. The n-type semiconductor region 59 is disposed in the p-type semiconductor region 57. The source electrode 61 is disposed on the highly doped n-type semiconductor region 59. The drain electrode 63 is disposed on the second surface 53b. The gate electrode 75 is disposed on an insulation layer 77 formed on the gallium nitride epitaxial layer 55. The p-type semiconductor region 57 includes an extension 57b disposed below the gate electrode 75. The material for the insulation layer can be a silicon oxide film, a silicon oxynitride film, a silicon nitride film, alumina, aluminum nitride, AlGaN, or the like. The thickness of the gallium nitride epitaxial layer 55 is at least 5 microns and no more than 1000 microns. Also, the carrier concentration of the gallium nitride epitaxial layer 55 is at least $1\times10^{14}$ cm$^{-3}$ and no more than $1\times10^{17}$ cm$^{-3}$.

The transistor 71 has a vertical structure with the source electrode 61 disposed on the n-type semiconductor region 59 and the drain electrode 63 disposed on the second surface 53b of the substrate, with current flowing from one to the other. Since the thickness of the gallium nitride epitaxial layer 55 is at least 5 microns and no more than 1000 microns and since the carrier concentration of the gallium nitride epitaxial layer 55 is at least $1\times10^{14}$ cm$^{-3}$ and no more than $1\times10^{17}$ cm$^{-3}$, it is possible to achieve an ideal breakdown with no punch-through by designing the thickness of the epitaxial layer and the carrier concentration appropriately.

By forming a p-type semiconductor region using ion implantation, a semiconductor element with a planar structure having a p-conductor semiconductor in the selected region can be formed. For the p-type dopant, magnesium or the like can be used. By forming an n-type semiconductor region using ion implantation, a semiconductor element with a planar structure having an n-conductive semiconductor can be formed. For the n-type dopant, silicon or the like can be used. The p-type semiconductor region 57 electrically isolates the n-type semiconductor region 59 from the epitaxial layer 55. The p-type semiconductor region 57 includes an extension 57b disposed below the insulation film under the gate electrode. When potential is applied to the gate electrode 75, an n-type inversion layer is formed at the boundary surface of the insulation film and the p-type region 57, and the potential passes from the n-type semiconductor region 59 through the carrier inversion layer and to the epitaxial layer 55. It would be preferable for the depth of the p-type semiconductor region 57 to be at least 0.1 micron and no more than 3 microns. It would be preferable for the surface portion of the p-type semiconductor region 57 to have a carrier concentration of at least $5\times10^{17}$ cm$^{-3}$. As shown in FIG. 9A, branches 75a of the gate electrode 75 are positioned between branches 61a of the source electrode 61. The corners of the electrodes 75, 61 are rounded to prevent breakdowns.

In the semiconductor elements 11, 31, 71 according to the first embodiment through the third embodiment, it would be preferable for the surface orientation of the first surface of the gallium nitride support base to be the (0001) face (including crystallographically equivalent faces). As a result, a low-dislocation GaN substrate can be provided. Also, in the semiconductor elements 11, 31, 71, it would be preferable for the surface orientation of the first surface of the gallium nitride support base to be (1-100) face (including crystallographically equivalent faces) or (11-20) face (including crystallographically equivalent faces). Taking into account inconsistencies in surface orientation, it would be preferable for the faces to be no more than +5 deg and no less than −5 deg from these crystal faces. With the semiconductor elements 11, 31, 71, the dislocation in the epitaxial layer is reduced, the reverse leakage current is reduced, and reverse breakdown is improved. Furthermore, with the semiconductor elements 11, 31, 71, it would be preferable for the dislocation density of the first surface of the gallium nitride support base to be at least $1\times10^{8}$ cm$^{-2}$. With this semiconductor element 11, 31, 71, the low dislocation density reduces dislocation in the epitaxial layer. As a result, the reverse leakage current is reduced and reverse breakdown improves. Furthermore, in the semiconductor elements 11, 31, 71, it would be preferable for the first surface of the gallium nitride support base to include a first area having a dislocation density of no more than $1\times10^{8}$ cm$^{-2}$ and a second area having a dislocation density greater than the dislocation density of the first area. With this semiconductor element 11, 31, 71, if the semiconductor element is formed in an area with a lower dislocation density, the dislocation in the epitaxial layer can be further reduced. As a result, the reverse leakage current is further reduced and reverse breakdown is improved.

FIFTH EMBODIMENT

Figure 10A:
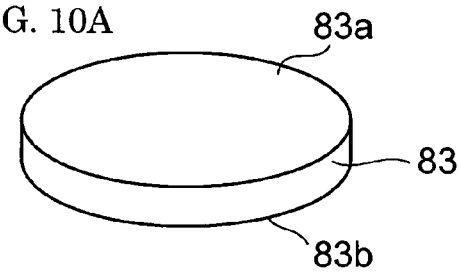
FIG. 10A through FIG. 10C are drawings illustrating the production of an epitaxial substrate according to a fifth embodiment.
Figure 10D:
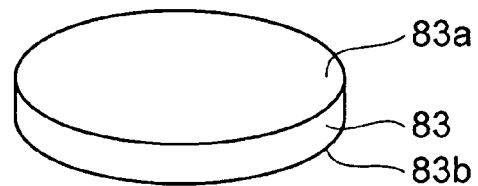
FIG. 10D through FIG. 10G are drawings illustrating the production of an epitaxial substrate.
Figure 10B:
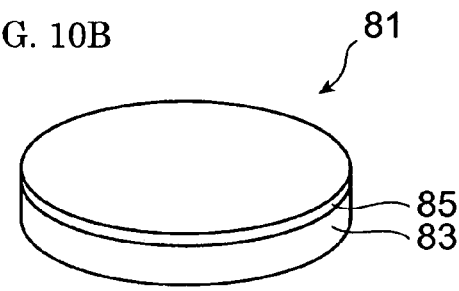
Figure 10E:
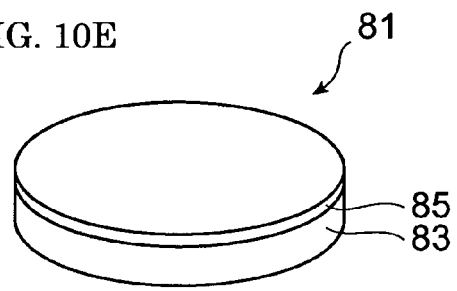
Figure 10C:
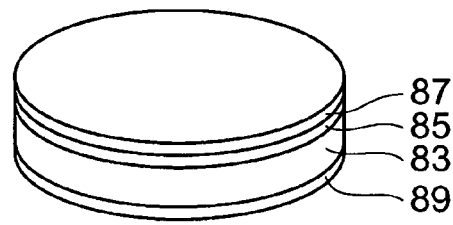

FIG. 10A through FIG. 10C illustrate the making of an epitaxial substrate according to a fifth embodiment. As shown in FIG. 10A, a gallium nitride free-standing substrate 83 is prepared. The n-conductive gallium nitride free-standing substrate 83 has a carrier concentration exceeding $1\times10^{18}$ cm$^{-3}$. As shown in FIG. 10B, an epitaxial film 85 is layered over a first surface 83a of the gallium nitride free-standing substrate 83. The thickness of the gallium nitride epitaxial film 85 is at least 5 microns and no more than 1000 microns. The gallium nitride epitaxial film 85 can, for example, have n-type conductivity, and the carrier concentration is at least $1\times10^{14}$ cm$^{-3}$ and no more than $1\times10^{16}$ cm$^{-3}$. This results in an epitaxial substrate 81. Using this substrate, semiconductor elements according to the first embodiment and the third embodiment can be made. It would be preferable for the gallium nitride epitaxial film 85 to be grown using HVPE.

As shown in FIG. 10C, a Schottky electrode film 87 is layered on the surface of the epitaxial film 85 of the epitaxial substrate 81, and an Ohmic electrode film 89 is layered on a second surface 83b of the substrate 83. Since the thickness of the gallium nitride epitaxial film 85 is at least 5 microns and no more than 1000 microns, and since the carrier concentration is at least $1\times10^{14}$ cm$^{-3}$ and no more than $1\times10^{17}$ cm$^{-3}$, the thickness of the epitaxial layer and the carrier concentration can be set up to achieve an ideal breakdown with no punch-through when a potential is applied between the Schottky electrode film 87 and the Ohmic electrode film 89. This provides an epitaxial substrate for semiconductor elements with improved breakdown.

In this epitaxial substrate 81, it would also be possible to form a p-type semiconductor region on the gallium nitride epitaxial film 85 and to form an n-type semiconductor region within this p-type semiconductor region. This provides an epitaxial substrate for transistors with improved breakdown.

Figure 10F:
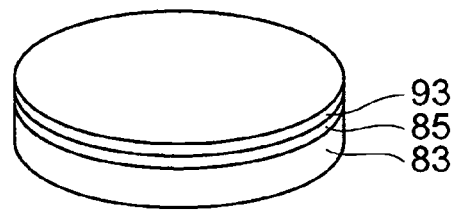

FIG. 10D through FIG. 10G illustrate the making of an epitaxial substrate. The epitaxial substrate 81 is made as shown in FIG. 10D and FIG. 10E. As shown in FIG. 10F, a p-type gallium nitride epitaxial film 93 is layered on the epitaxial substrate 81 to make an epitaxial substrate 91. It would be preferable for the gallium nitride epitaxial film 93 to be grown using metal-organic vapor phase growth epitaxy method. The carrier concentration of the gallium nitride epitaxial film 93 is greater than the carrier concentration of the gallium nitride epitaxial film 85 so that the depletion layer is formed mainly on the gallium nitride epitaxial film 85.

Figure 10G:
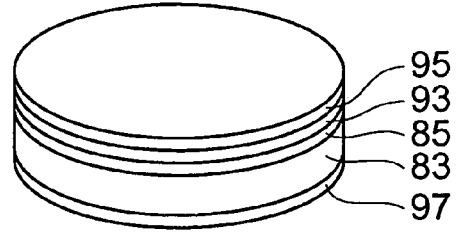

As shown in FIG. 10G, an Ohmic electrode film 95 is layered on the epitaxial film 93 of the epitaxial substrate 91, and an Ohmic electrode film 97 is layered on the second surface 83b. Since the thickness of the gallium nitride epitaxial film 85 is at least 5 microns and no more than 1000 microns, and since the carrier concentration of the gallium nitride epitaxial film 85 is at least $1\times10^{14}$ cm$^{-3}$ and no more than $1\times10^{17}$ cm$^{-3}$, the thickness of the epitaxial layer and the carrier concentration can be set up to achieve an ideal breakdown with no punch-through when a potential is applied between the Ohmic electrode film 95 and the Ohmic electrode film 97. This provides the epitaxial substrate 91 for semiconductor elements with improved breakdown.

In the epitaxial substrates 81, 91 described above, the epitaxial film 85 can be grown with HVPE to grow an epitaxial film with a thickness of up to approximately 1000 microns within a practical amount of time. With the epitaxial substrate 91, using metal-organic vapor phase growth epitaxy can provide a high-quality epitaxial film. Also, with the epitaxial substrates 81, 91, it would be preferable for the surface orientation of the first surface 83a of the gallium nitride free-standing substrate 83 to be (0001) (including crystallographically equivalent faces). With this epitaxial substrate, a low-dislocation GaN free-standing substrate can be provided. Furthermore, with the epitaxial substrates 81, 91, it would be preferable for the surface orientation of the first surface 83a of the gallium nitride free-standing substrate to be within a range of no more than +5 dog and at least −5 deg of either the (1-100) face (including crystallographically equivalent faces) and the (11-20) face (including crystallographically equivalent faces). With the epitaxial substrates 81, 91, dislocation within the epitaxial layer is reduced, reverse leakage current is reduced, and reverse breakdown is improved.

Figure 11A:
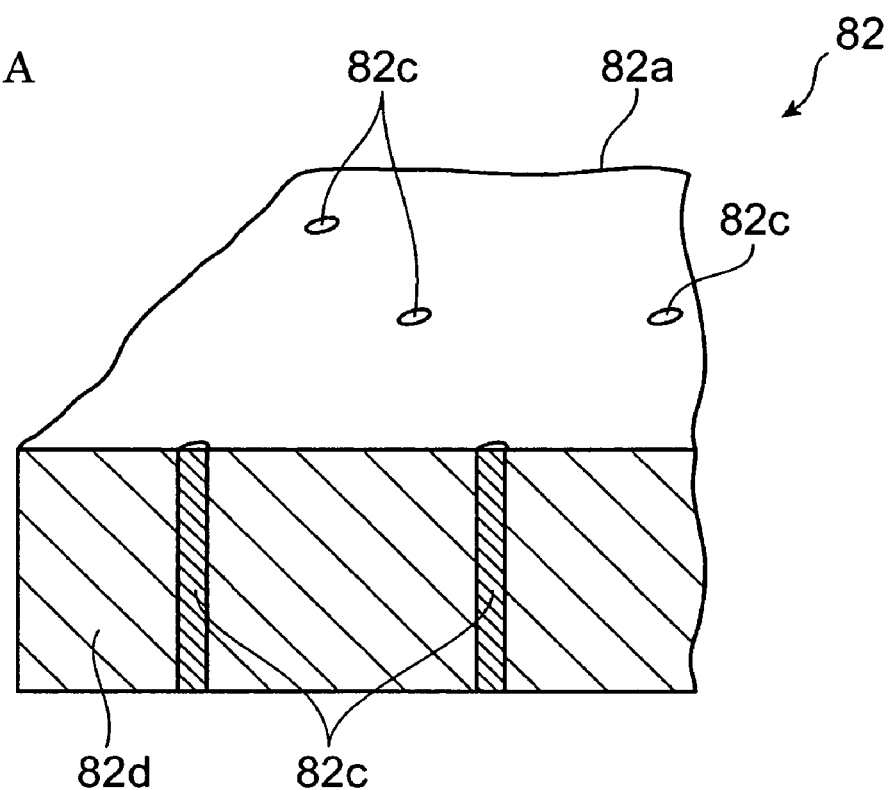
FIG. 11A is a drawing showing one arrangement of high-displacement regions and low-displacement regions in a free-standing substrate.
Figure 11B:
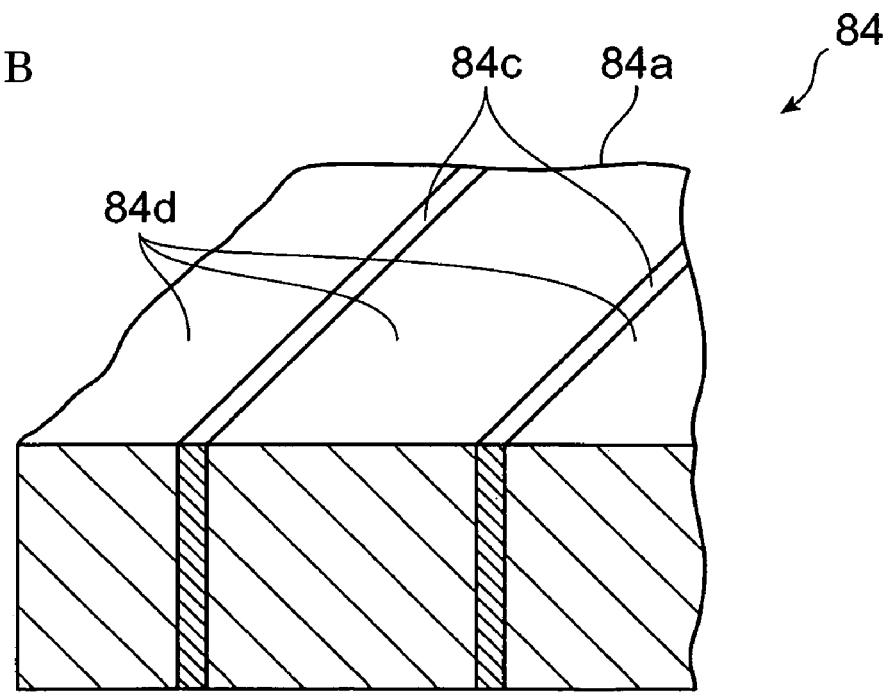
FIG. 11B is a drawing showing another arrangement of high-displacement regions and low-displacement regions in a free-standing substrate.

FIG. 11A is a drawing showing one arrangement of high-dislocation regions and low-dislocation regions on a GaN free-standing substrate. FIG. 11B is a drawing showing another arrangement of high-dislocation regions and low-dislocation regions on a GaN free-standing substrate. The first surface 82a of the gallium nitride free-standing substrate 82 for the epitaxial substrates 81, 91 include first areas, on which appear high-dislocation regions 82c having relatively large threading dislocation densities, and second areas, on which appear low-dislocation regions 82d having relatively small threading-dislocation densities. The high-dislocation regions 82c are surrounded by the low-dislocation regions 82d, and, on the first surface 82a, the first areas are distributed randomly as dots in the second area. The threading dislocation density overall is, e.g., no more than $1 \times 10^8$ cm$^{-2}$. With these epitaxial substrates 81, 91, the low dislocation density results in reduced dislocation within the epitaxial layer. As a result, the reverse leakage current is reduced and reverse breakdown improves.

In a gallium nitride free-standing substrate 84 shown in FIG. 11B, a first surface 84a includes first areas on which appear high-dislocation regions 84c having relatively high threading dislocation densities and second areas on which appear low-dislocation regions 84d having relatively low threading dislocation densities. The low-dislocation regions 82d extend along the high-dislocation regions 82c. As a result, on the first surface 84a, the first areas (striped regions) and the second areas (striped regions) are arranged in an alternating manner. Each low-dislocation region 84d is separated from other low-dislocation regions 82d by high-dislocation regions 84c.

The threading dislocation density of the low-dislocation regions is at least $1 \times 10^8$ cm$^{-2}$, and the threading potential density is higher than the dislocation density of the first areas, e.g., at least $1 \times 10^8$ cm$^{-2}$. By forming a semiconductor element on an area with a lower dislocation density, the dislocation in the epitaxial film can be further reduced. As a result, the reverse leakage current is further reduced, and reverse breakdown is improved.

A high reverse breakdown voltage semiconductor element that uses gallium nitride semiconductor can provide a higher reverse breakdown voltage and a lower forward "on" resistance compared to a semiconductor element that uses silicon semiconductor.

The principles of the present invention have been described using preferred embodiments, but one skilled in the art would understand that arrangements and details may be changed without departing from these principles of the present invention. The present invention is not limited to the specific structures disclosed in the embodiments. For example, normal-off transistors were described, but the present invention is not limited to this. Thus, the present invention encompasses the scope of the claims as well as all corrections and modifications that can be made within the spirit of the claims.

What is claimed is:

1. An epitaxial substrate comprising:
   a gallium nitride free-standing substrate including a first surface and a second surface opposite from said first surface and having a carrier concentration exceeding $1 \times 10^{18}$ cm$^{-3}$; and
   a first gallium nitride epitaxial film disposed on said first surface;
   wherein:
   said first gallium nitride epitaxial film has a thickness of at least 5 microns and no more than 1000 microns; and
   said first gallium nitride epitaxial film has a carrier concentration of at least $1 \times 10^{14}$ cm$^{-3}$ and no more than $1 \times 10^{17}$ cm$^{-3}$.

2. An epitaxial substrate as described in claim 1 comprising:
   a p-type semiconductor region disposed in said first gallium nitride epitaxial film; and
   an n-type semiconductor region disposed in said p-type semiconductor region;
   wherein said first gallium nitride epitaxial film and said gallium nitride free-standing substrate has n-type conductivity.

3. An epitaxial substrate as described in claim 1 further comprising a second gallium nitride epitaxial film disposed on said first gallium nitride epitaxial film and including a p-type dopant.

4. An epitaxial substrate as described in claim 3 wherein said p-type dopant is introduced using ion implantation.

5. An epitaxial substrate as described in claim 3 wherein said second gallium nitride epitaxial film is formed using metal-organic vapor phase growth epitaxy.

6. An epitaxial substrate as described in claim 1 wherein said first surface of said gallium nitride free-standing substrate has a surface orientation that is within a range of no more than +5 deg and at least −5 deg of (0001).

7. An epitaxial substrate as described in claim 1 wherein said first surface of said gallium nitride free-standing substrate has a surface orientation that is within a range of no more than +5 deg and at least −5 deg of either (1-100) or (11-20).

8. An epitaxial substrate as described in claim 1 wherein said first surface of said gallium nitride free-standing substrate has a dislocation density of no more than $1 \times 10^8$ cm$^{-2}$.

9. An epitaxial substrate as described in claim 1 wherein said first surface of said gallium nitride free-standing substrate includes a first area with a dislocation density of no more than $1 \times 10^8$ cm$^{-2}$ and a second area with a dislocation density greater than said dislocation density of said first area.

10. An epitaxial substrate as described in claim 1 wherein said first gallium nitride epitaxial film is grown using HVPE.

11. In a semiconductor element containing a group III nitride semiconductor element,
    a semiconductor element comprising:
    a gallium nitride support base including an upper surface and a lower surface opposite from said upper surface and having a carrier concentration exceeding $1 \times 10^{18}$ cm$^{-3}$;
    a first gallium nitride epitaxial layer disposed on said upper surface;
    an Ohmic electrode disposed on said lower surface; and
    a Schottky electrode disposed on said first gallium nitride epitaxial layer;
    wherein:
    said first gallium nitride epitaxial layer has a thickness of at least 5 microns and no more than 1000 microns ;
    said first gallium nitride epitaxial layer has a carrier concentration of at least $1 \times 10^{14}$ cm$^{-3}$ and no more than $1 \times 10^{17}$ cm$^{-3}$; and
    said semiconductor element is a Schottky diode.

12. A semiconductor element as described in claim 11 wherein said upper surface of said gallium nitride support base has a surface orientation that is within a range of no more than +5 deg and at least −5 deg of (0001).

13. A semiconductor element as described in claim 11 wherein said upper surface of said gallium nitride free-standing substrate has a surface orientation that is within a range of no more than +5 deg and at least −5 deg of either (1-100) or (11-20).

14. A semiconductor element as described in claim 11 wherein said upper surface of said gallium nitride support base has a dislocation density of no more than $1 \times 10^8$ cm$^{-2}$.

15. A semiconductor element as described in claim 11 wherein said upper surface of said gallium nitride support base includes a first area with a dislocation density of no more than $1 \times 10^8$ cm$^{-2}$ and a second area with a dislocation density greater than said dislocation density of said first area.

16. A semiconductor element as described in claim 11, having a reverse breakdown voltage with an absolute value in excess of 150 volts.

17. In a semiconductor element containing a group III nitride semiconductor element,
a semiconductor element comprising:
a gallium nitride support base including a first surface and a second surface opposite from said first surface and having a carrier concentration exceeding $1\times10^{18}$ cm$^{-3}$;
a first gallium nitride epitaxial layer disposed on said first surface;
an Ohmic electrode disposed on said second surface;
a second gallium nitride epitaxial layer disposed on said first gallium nitride epitaxial layer and containing a p-type dopant; and
an Ohmic electrode disposed on said second gallium nitride epitaxial layer;
wherein:
said gallium nitride support base has n-type conductivity;
said first gallium nitride epitaxial layer has a thickness of at least 5 microns and no more than 1000 microns;
said first gallium nitride epitaxial layer has a carrier concentration of at least $1\times10^{14}$ cm$^{-3}$ and no more than $1\times10^{17}$ cm$^{-3}$; and
said semiconductor element is a pn-junction diode.

18. A semiconductor element as described in claim 17 wherein said first surface of said gallium nitride support base has a surface orientation that is within a range of no more than +5 deg and at least −5 deg of (0001).

19. A semiconductor element as described in claim 17 wherein said first surface of said gallium nitride free-standing substrate has a surface orientation that is within a range of no more than +5 deg and at least −5 deg of either (1-100) or (11-20).

20. A semiconductor element as described in claim 17 wherein said first surface of said gallium nitride support base has a dislocation density of no more than $1\times10^{8}$ cm$^{-2}$.

21. A semiconductor element as described in claim 17 wherein said first surface of said gallium nitride support base includes a first area with a dislocation density of no more than $1\times10^{8}$ cm$^{-2}$ and a second area with a dislocation density greater than said dislocation density of said first area.

22. In a semiconductor element containing a group III nitride semiconductor element,
a semiconductor element comprising:
a gallium nitride support base including a first surface and a second surface opposite from said first surface and having a carrier concentration exceeding $1\times10^{18}$ cm$^{-3}$;
a first gallium nitride epitaxial layer disposed on said first surface;
a p-type semiconductor region disposed in said first gallium nitride epitaxial layer;
an n-type semiconductor region disposed in said p-type semiconductor region;
a source electrode disposed on said n-type semiconductor region;
a drain electrode disposed on said second surface;
an insulation layer disposed on said first gallium nitride epitaxial film; and
a gate electrode disposed on said insulation layer;
wherein:
said first gallium nitride epitaxial layer has a thickness of at least 5 microns and no more than 1000 microns ;
said first gallium nitride epitaxial layer has a carrier concentration of at least $1\times10^{14}$ cm$^{-3}$ and no more than $1\times10^{17}$ cm$^{-3}$; and
said semiconductor element is an MIS transistor.

23. A semiconductor element as described in claim 22 wherein a p-type dopant of said p-type semiconductor region is introduced using ion implantation.

24. A semiconductor element as described in claim 22 wherein an n-type dopant of said n-type semiconductor region is introduced using ion implantation.

25. A semiconductor element as described in claim 22 wherein said first surface of said gallium nitride support base has a surface orientation that is within a range of no more than +5 deg and at least −5 deg of (0001).

26. A semiconductor element as described in claim 22 wherein said first surface of said gallium nitride free-standing substrate has a surface orientation that is within a range of no more than +5 deg and at least −5 deg of either (1-100) or (11-20).

27. A semiconductor element as described in claim 22 wherein said first surface of said gallium nitride support base has a dislocation density of no more than $1\times10^{8}$ cm$^{-2}$.

28. A semiconductor element as described in claim 22 wherein said first surface of said gallium nitride support base includes a first area with a dislocation density of no more than $1\times10^{8}$ cm$^{-2}$ and a second area with a dislocation density greater than said dislocation density of said first area.

* * * * *